US008980653B2

(12) United States Patent
Ananthan

(10) Patent No.: US 8,980,653 B2
(45) Date of Patent: Mar. 17, 2015

(54) COMBINATORIAL OPTIMIZATION OF INTERLAYER PARAMETERS

(71) Applicant: Venkat Ananthan, Cupertino, CA (US)

(72) Inventor: Venkat Ananthan, Cupertino, CA (US)

(73) Assignee: Intermolecular, Inc., San Jose, CA (US)

( * ) Notice: Subject to any disclaimer, the term of this patent is extended or adjusted under 35 U.S.C. 154(b) by 303 days.

(21) Appl. No.: 13/622,750

(22) Filed: Sep. 19, 2012

(65) Prior Publication Data
US 2014/0080233 A1 Mar. 20, 2014

(51) Int. Cl.
*G01R 31/26* (2014.01)
*H01L 21/66* (2006.01)
*H01L 21/20* (2006.01)
*H01L 21/3205* (2006.01)
*H01L 49/02* (2006.01)

(52) U.S. Cl.
CPC ............ *H01L 28/40* (2013.01); *H01L 22/12* (2013.01); *H01L 22/20* (2013.01); *H01L 28/65* (2013.01)
USPC ............ 438/16; 438/17; 438/396; 438/591

(58) Field of Classification Search
None
See application file for complete search history.

(56) References Cited

U.S. PATENT DOCUMENTS

| | | | |
|---|---|---|---|
| 4,871,078 A * | 10/1989 | Sharp | 405/53 |
| 6,045,671 A * | 4/2000 | Wu et al. | 506/40 |
| 6,491,759 B1 | 12/2002 | Christen et al. | |
| 6,576,906 B1 | 6/2003 | Archibald et al. | |
| 6,787,430 B2 * | 9/2004 | Kanamori | 438/393 |
| 7,242,000 B2 | 7/2007 | Archibald et al. | |
| 7,824,935 B2 * | 11/2010 | Verma et al. | 438/18 |
| 2009/0061108 A1 * | 3/2009 | Endo et al. | 427/569 |
| 2011/0176355 A1 * | 7/2011 | Furutani et al. | 365/149 |
| 2012/0032164 A1 * | 2/2012 | Ohnuki | 257/43 |

OTHER PUBLICATIONS

Diebold, Ulrike; The surface science of titanium dioxide; 2003; Elsevier; Surface Science Reports; pp. 53-229.
Webb, D.J., et al.; In-situ MBE Si as passivating interlayer on GaAs for HfO2 MOSCAP's: effect of GaAs surface reconstruction; 2007; Elsevier; Science Direct Microelectronic Engineering 84; pp. 2142-2145.

* cited by examiner

*Primary Examiner* — Charles Garber
*Assistant Examiner* — Ron Pompey

(57) ABSTRACT

The embodiments describe methods and apparatuses for combinatorial optimization of interlayer parameters for capacitor stacks. The capacitor stacks may include a substrate, an insulating layer disposed on the substrate, a ruthenium disposed electrode on the insulating layer, and an interlayer disposed on the ruthenium electrode, where the interlayer is configured to prevent etching of the electrode when growing a high-k dielectric using an ozone-based precursor. The parameters for forming the interlayer may include interlayer thickness, precursor chemistry, oxidant strength, precursor purge times, oxidant purge times, and other suitable parameters. Each of these parameters may be evaluated through deposition of the capacitor stacks through a combinatorial optimization process. Thus, a plurality of different parameters may be evaluated with a single substrate to ascertain associated properties of Ruthenium electrode etching in a combinatorial manner.

14 Claims, 7 Drawing Sheets

COMBINATORIAL OPTIMIZATION OF INTERLAYER PARAMETERS

BACKGROUND

Generally, metal-insulator-metal (MIM) capacitor stacks are created on a semiconductor substrate through a number of processing steps. For example, a dielectric and electrodes are formed on a substrate and subjected to a number of processes to alter functional characteristics of the devices and increase longevity. In order to increase capacitance while decreasing a size of the MIM capacitor stacks, new material discovery and testing is required.

Conventional testing has shown that titanium oxides may form suitable dielectrics for capacitor stacks when high work function materials are included as electrodes. However, given the relatively reactive nature of the precursor chemistries for most rutile Titanium Oxides, protective interlayers may be necessary to reduce or mitigate damage to the electrode surface, especially where ozone is utilized as an oxidant in the deposition process of the bulk Titanium oxide layer. In order for the Titanium Oxides to form adequate high dielectric constant layers on these interlayers and to reduce leakage, further research, development, and careful optimization is necessary.

SUMMARY

In some embodiments, a method of combinatorial optimization of interlayer parameters includes depositing a first electrode on a substrate, combinatorially forming a plurality of interlayers on separate regions of the electrode, the plurality of interlayers being formed based on at least one sequentially altered parameter, depositing a bulk oxide layer across the plurality of interlayers, determining a change in thickness of the first electrode for each separate region of the electrode after depositing the bulk oxide layer, and determining prospective interlayer parameters based on the change in thickness of the first electrode.

These and further aspects of the invention are described more fully below.

DETAILED DESCRIPTION

Figure 1:
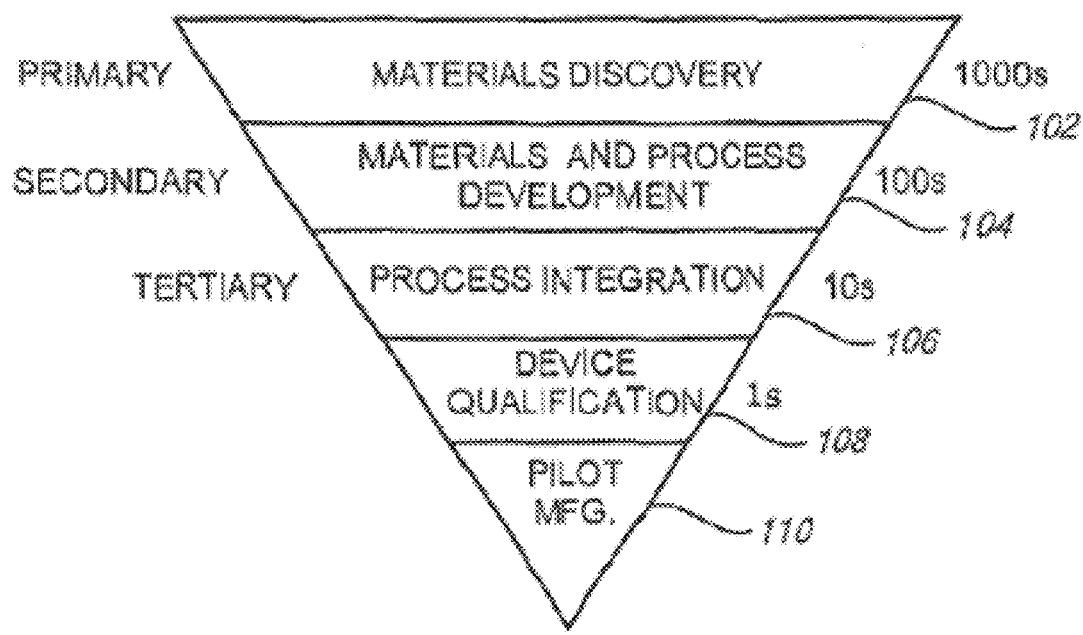
FIG. 1 illustrates a simplified schematic diagram providing an overview of the High-Productivity Combinatorial (HPC) screening process for use in evaluating materials, unit processes, and process sequences for the manufacturing of semiconductor devices in accordance with some embodiments.

Those skilled in the relevant art will recognize that many changes can be made to the embodiments described, while still obtaining the beneficial results. It will also be apparent that some of the desired benefits of the embodiments described can be obtained by selecting some of the features of the embodiments without utilizing other features. Accordingly, those who work in the art will recognize that many modifications and adaptations to the embodiments described are possible and may even be desirable in certain circumstances, and are a part of the invention. Thus, the following description is provided as illustrative of the principles of the embodiments of the invention and not in limitation thereof, since the scope of the invention is defined by the claims. It will be obvious, however, to one skilled in the art, that the embodiments described may be practiced without some or all of these specific details. In other instances, well known process operations have not been described in detail in order not to unnecessarily obscure the present invention.

The embodiments describe methods and apparatuses for combinatorial optimization of interlayer parameters for capacitor stacks. The capacitor stacks may include a substrate, an insulating layer disposed on the substrate, a ruthenium disposed electrode on the insulating layer, and an interlayer disposed on the Ruthenium electrode, where the interlayer is configured to prevent etching of the electrode when growing a high-k dielectric using an ozone-based precursor. The parameters for forming the interlayer may include interlayer thickness, precursor chemistry, oxidant strength, precursor purge times, oxidant purge times, and other suitable parameters. Each of these parameters may be evaluated through deposition of the capacitor stacks through a combinatorial optimization process. Thus, a plurality of different parameters may be evaluated with a single substrate to ascertain associated properties of Ruthenium electrode etching in a combinatorial manner. Accordingly, the embodiments described below may be integrated with combinatorial processing techniques described in more detail below.

Semiconductor manufacturing typically includes a series of processing steps such as cleaning, surface preparation, deposition, patterning, etching, thermal annealing, and other related unit processing steps. The precise sequencing and integration of the unit processing steps enables the formation of functional devices meeting desired performance metrics such as efficiency, power production, and reliability.

As part of the discovery, optimization and qualification of each unit process, it is desirable to be able to (i) test different materials, (ii) test different processing conditions within each unit process module, (iii) test different sequencing and integration of processing modules within an integrated processing tool, (iv) test different sequencing of processing tools in executing different process sequence integration flows, and combinations thereof in the manufacture of devices such as integrated circuits. In particular, there is a need to be able to test (i) more than one material, (ii) more than one processing condition, (iii) more than one sequence of processing conditions, (iv) more than one process sequence integration flow, and combinations thereof, collectively known as "combinatorial process sequence integration," on a single monolithic substrate without the need for consuming the equivalent number of monolithic substrates per materials, processing conditions, sequences of processing conditions, sequences of processes, and combinations thereof. This can greatly improve both the speed and reduce the costs associated with the discovery, implementation, optimization, and qualification of materials, processes, and process integration sequences required for manufacturing.

High Productivity Combinatorial (HPC) processing techniques have been successfully adapted to wet chemical processing such as etching and cleaning. HPC processing techniques have also been successfully adapted to deposition processes such as physical vapor deposition (PVD), atomic layer deposition (ALD), and chemical vapor deposition (CVD).

Systems and methods for HPC processing are described in U.S. Pat. No. 7,544,574, filed on Feb. 10, 2006; U.S. Pat. No. 7,824,935, filed on Jul. 2, 2008; U.S. Pat. No. 7,871,928, filed on May 4, 2009; U.S. Pat. No. 7,902,063, filed on Feb. 10, 2006; and U.S. Pat. No. 7,947,531, filed on Aug. 28, 2009 each of which is incorporated by reference herein. Systems and methods for HPC processing are further described in U.S. patent application Ser. No. 11/352,077, filed on Feb. 10, 2006; U.S. patent application Ser. No. 11/419,174, filed on May 18, 2006; U.S. patent application Ser. No. 11/674,132, filed on Feb. 12, 2007; and U.S. patent application Ser. No. 11/674,137, filed on Feb. 12, 2007. The aforementioned patent applications claim priority from provisional patent application 60/725,186 filed Oct. 11, 2005. Each of the aforementioned patent applications and the provisional patent application are incorporated by reference herein.

FIG. 1 illustrates a schematic diagram 100 for implementing combinatorial processing and evaluation using primary, secondary, and tertiary screening. The schematic diagram 100 illustrates that the relative number of combinatorial processes run with a group of substrates decreases as certain materials and/or processes are selected. Generally, combinatorial processing includes performing a large number of processes during a primary screen, selecting promising candidates from those processes, performing the selected processing during a secondary screen, selecting promising candidates from the secondary screen for a tertiary screen, and so on. In addition, feedback from later stages to earlier stages can be used to refine the success criteria and provide better screening results.

For example, thousands of materials are evaluated during a materials discovery stage 102. Materials discovery stage 102 is also known as a primary screening stage performed using primary screening techniques. Primary screening techniques may include dividing substrates into coupons and depositing materials using varied processes. The materials are then evaluated, and promising candidates are advanced to the secondary screen, or materials and process development stage 104. Evaluation of the materials is performed using metrology tools such as electronic testers and imaging tools (e.g., microscopes).

The materials and process development stage 104 may evaluate hundreds of materials (i.e., a magnitude smaller than the primary stage) and may focus on the processes used to deposit or develop those materials. Promising materials and processes are again selected, and advanced to the tertiary screen or process integration stage 106 where tens of materials and/or processes and combinations are evaluated. The tertiary screen or process integration stage 106 may focus on integrating the selected processes and materials with other processes and materials.

The most promising materials and processes from the tertiary screen are advanced to device qualification 108. In device qualification, the materials and processes selected are evaluated for high volume manufacturing, which normally is conducted on full substrates within production tools, but need not be conducted in such a manner. The results are evaluated to determine the efficacy of the selected materials and processes. If successful, the use of the screened materials and processes can proceed to pilot manufacturing 110.

The schematic diagram 100 is an example of various techniques that may be used to evaluate and select materials and processes for the development of new materials and processes. The descriptions of primary, secondary, etc. screening and the various stages 102-110 are arbitrary and the stages may overlap, occur out of sequence, be described and be performed in many other ways.

This application benefits from High Productivity Combinatorial (HPC) techniques described in U.S. patent application Ser. No. 11/674,137, filed on Feb. 12, 2007, which is hereby incorporated by reference in its entirety. Portions of the '137 application have been reproduced below to enhance the understanding of the embodiments disclosed herein. The embodiments disclosed enable the application of combinatorial techniques to process sequence integration in order to arrive at a globally optimal sequence of semiconductor manufacturing operations by considering interaction effects between the unit manufacturing operations, the process conditions used to effect such unit manufacturing operations, hardware details used during the processing, as well as material characteristics of components utilized within the unit manufacturing operations. Rather than only considering a series of local optimums, i.e., where the best conditions and materials for each manufacturing unit operation is considered in isolation, the embodiments described below consider effects of interactions introduced due to the multitude of processing operations that are performed and the order in which such multitude of processing operations are performed when fabricating a device. A global optimum sequence order is therefore derived, and as part of this derivation, the unit processes, unit process parameters, and materials used in the unit process operations of the optimum sequence order are also considered.

The embodiments described further analyze a portion or sub-set of the overall process sequence used to manufacture a semiconductor device. Once the subset of the process sequence is identified for analysis, combinatorial process sequence integration testing is performed to optimize the materials, unit processes, hardware details, and process sequence used to build that portion of the device or structure. During the processing of some embodiments described herein, structures are formed on the processed substrate that are equivalent to the structures formed during actual production of the semiconductor device. For example, such structures may include, but would not be limited to, contact layers, buffer layers, absorber layers, or any other series of layers or unit processes that create an intermediate structure found on semiconductor devices. While the combinatorial processing varies certain materials, unit processes, hardware details, or process sequences, the composition or thickness of the layers or structures or the action of the unit process, such as cleaning, surface preparation, deposition, surface treatment, etc. is substantially uniform throughout each discrete region. Furthermore, while different materials or unit processes may be used for corresponding layers or steps in the formation of a structure in different regions of the substrate during the combinatorial processing, the application of each layer or use of a given unit process is substantially consistent or uniform throughout the different regions in which it is intentionally applied. Thus, the processing is uniform within a region (inter-region uniformity) and between regions (intra-region uniformity), as desired. It should be noted that the process can be varied between regions, for example, where a thickness of a layer is varied or a material may be varied between the regions, etc., as desired by the design of the experiment.

The result is a series of regions on the substrate that contain structures or unit process sequences that have been uniformly applied within that region and, as applicable, across different regions. This process uniformity allows comparison of the properties within and across the different regions such that the variations in test results are due to the varied parameters (e.g., materials, unit processes, unit process parameters, hardware details, or process sequences) and not the lack of process uniformity. In the embodiments described herein, the positions of the discrete regions on the substrate can be defined as needed, but are preferably systematized for ease of tooling and design of experimentation. In addition, the number, variants and location of structures within each region are designed to enable valid statistical analysis of the test results within each region and across regions to be performed.

Figure 2:
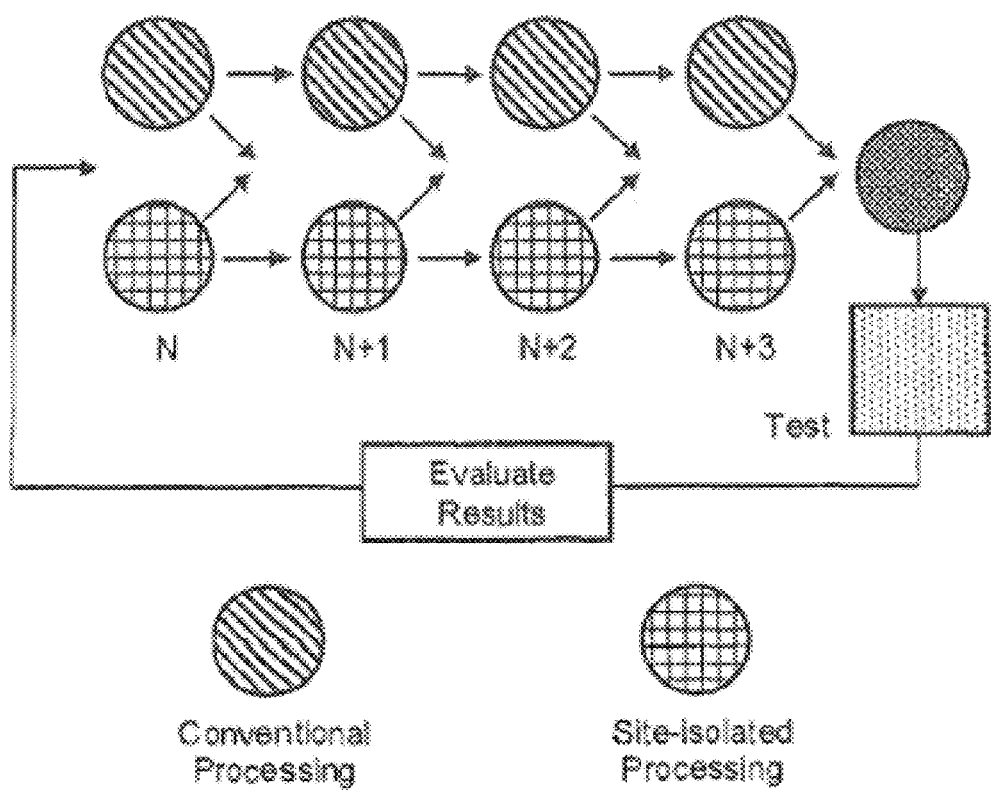
FIG. 2 illustrates a flowchart of a general methodology for combinatorial process sequence integration that includes site-isolated processing and/or conventional processing in accordance with some embodiments.

FIG. 2 is a simplified schematic diagram illustrating a general methodology for combinatorial process sequence integration that includes site isolated processing and/or conventional processing in accordance with one embodiment of the invention. In one embodiment, the substrate is initially processed using conventional process N. In one exemplary embodiment, the substrate is then processed using site isolated process N+1. During site isolated processing, an HPC module may be used, such as the HPC module described in U.S. patent application Ser. No. 11/352,077 filed on Feb. 10, 2006. The substrate can then be processed using site isolated process N+2, and thereafter processed using conventional process N+3. Testing is performed and the results are evaluated. The testing can include physical, chemical, acoustic, magnetic, electrical, optical, etc. tests. From this evaluation, a particular process from the various site isolated processes (e.g., from steps N+1 and N+2) may be selected and fixed so that additional combinatorial process sequence integration may be performed using site isolated processing for either process N or N+3. For example, a next process sequence can include processing the substrate using site isolated process N, conventional processing for processes N+1, N+2, and N+3, with testing performed thereafter.

It should be appreciated that various other combinations of conventional and combinatorial processes can be included in the processing sequence with regard to FIG. 2. That is, the combinatorial process sequence integration can be applied to any desired segments and/or portions of an overall process flow. Characterization, including physical, chemical, acoustic, magnetic, electrical, optical, etc. testing, can be performed after each process operation, and/or series of process operations within the process flow as desired. The feedback provided by the testing is used to select certain materials, processes, process conditions, and process sequences and eliminate others. Furthermore, the above flows can be applied to entire monolithic substrates, or portions of monolithic substrates such as coupons.

Under combinatorial processing operations the processing conditions at different regions can be controlled independently. Consequently, process material amounts, reactant species, processing temperatures, processing times, processing pressures, processing flow rates, processing powers, processing reagent compositions, the rates at which the reactions are quenched, deposition order of process materials, process sequence steps, hardware details, etc., can be varied from region to region on the substrate. Thus, for example, when exploring materials, a processing material delivered to a first and second region can be the same or different. If the processing material delivered to the first region is the same as the processing material delivered to the second region, this processing material can be offered to the first and second regions on the substrate at different concentrations. In addition, the material can be deposited under different processing parameters. Parameters which can be varied include, but are not limited to, process material amounts, reactant species, processing temperatures, processing times, processing pressures, processing flow rates, processing powers, processing reagent compositions, the rates at which the reactions are quenched, atmospheres in which the processes are conducted, an order in which materials are deposited, hardware details of the gas distribution assembly, etc. It should be appreciated that these process parameters are exemplary and not meant to be an exhaustive list as other process parameters commonly used in semiconductor manufacturing may be varied.

As mentioned above, within a region, the process conditions are substantially uniform, in contrast to gradient processing techniques which rely on the inherent non-uniformity of the material deposition. That is, the embodiments described herein perform the processing locally in a conventional manner, i.e., substantially consistent and substantially uniform, while globally over the substrate, the materials, processes, and process sequences may vary. Thus, the testing will find optimums without interference from process variation differences between processes that are meant to be the same. It should be appreciated that a region may be adjacent to another region in one embodiment or the regions may be isolated and, therefore, non-overlapping. When the regions are adjacent, there may be a slight overlap wherein the materials or precise process interactions are not known, however, a portion of the regions, normally at least 50% or more of the area, is uniform and all testing occurs within that region. Further, the potential overlap is only allowed with material of processes that will not adversely affect the result of the tests. Both types of regions are referred to herein as regions or discrete regions.

Figure 3:
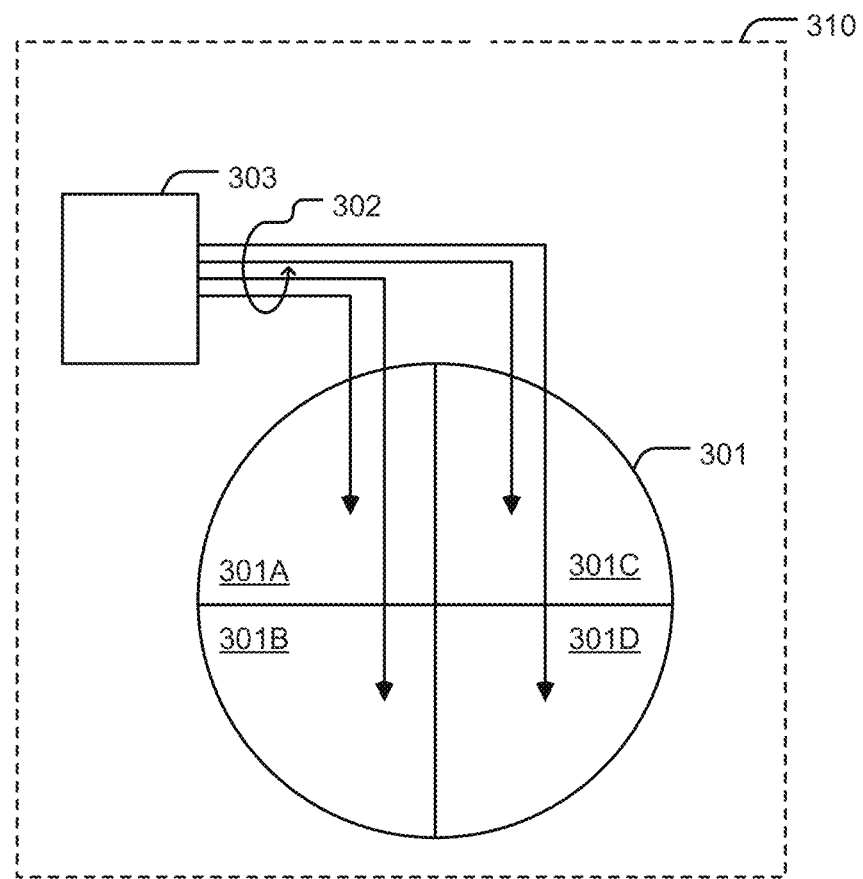
FIG. 3 illustrates a combinatorial deposition apparatus, according to some embodiments.

As stated above, under combinatorial processing operations the processing conditions at different regions can be controlled independently. According to some embodiments of the present invention, individual apparatuses for controlled deposition onto different regions of a substrate for optimization of interlayer parameters are provided. For example, turning to FIG. 3, a combinatorial deposition apparatus is illustrated.

As illustrated, the apparatus includes an atomic layer deposition (ALD) chamber 310. The ALD chamber 310 may be any suitable reaction chamber configurable to allow the sequential exposure of a substrate 301 to one or more precursor chemistries. The precursor chemistries react with a surface of the substrate 301 to form a self-limiting conformal thin film of material. The ALD chamber 310 may include a central purge gas curtain configured to divide the substrate 301 into a plurality of regions, which may also be referred to as partitions, 301A, 301B, 301C, and 301D. In some embodiments, each region of the plurality of regions is a site isolated region. Although particularly illustrated as quadrants, it should be understood that the same may be varied in many ways to include more or less regions as desired.

Each site isolated region 301A, 301B, 301C, and 301D may receive a separate supply 302 of precursor chemistries from a centralized distribution hub 303 configured to combinatorially optimize interlayer parameters as described herein. The central purge gas curtain may be embodied as one or more jets of inert gas which substantially limit exposure of the regions to precursor chemistries of adjacent partitions supplied through the supplies 302 to isolate the regions. Accordingly, separate sequential and self-limiting layers may be formed in each region 301A, 301B, 301C, and 301D such that a combinatorial optimization process may be performed. For example, turning to FIGS. 4-9, a method of combinatorially optimizing interlayer parameters is illustrated.

Figure 4:
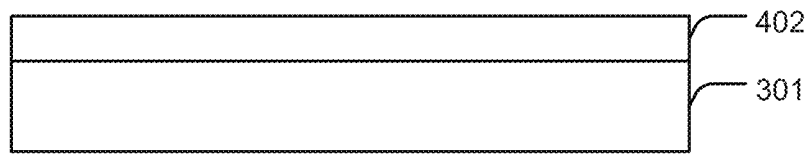
FIG. 4 illustrates a portion of a method of combinatorial optimization of interlayer parameters, according to some embodiments.

As shown in FIG. 4, an oxide layer 402 may be deposited or formed on a portion of substrate 301. The oxide layer 402 may be a layer approximately 3000 Å thick according to some embodiments. According to other embodiments, the oxide layer 402 is optional and may be omitted. It should be appreciated that the oxide layer 402 may be deposited through any conventional deposition process where the entire surface of the substrate is deposited substantially uniformly with the oxide layer.

Figure 5:
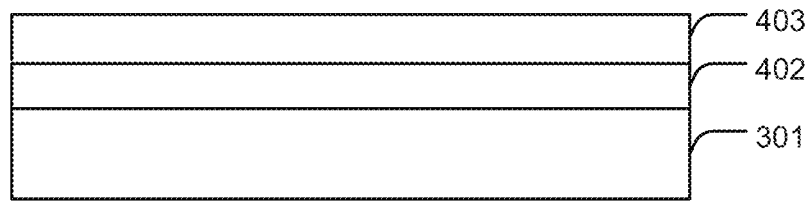
FIG. 5 illustrates a portion of a method of combinatorial optimization of interlayer parameters, according to some embodiments.

Moving to FIG. 5, the method may include forming or depositing an electrode 403 on the oxide layer 402 or the substrate 301. The electrode 403 may be formed combinatorially using an Atomic Layer Deposition (ALD) chamber as described above. The electrode 403 may be composed of a relatively high work function metal or conductor. In some embodiments the work function of the metal is greater than or equal to 4.7 eV. The electrode 403 may be formed of Ruthenium (Ru) in some embodiments. It should be appreciated that electrode 403 could be other metal layers that are etched away when the interlayer 404 is being deposited using ALD. The electrode 403 may be analyzed through any desired form of chemical analysis or other testing to determine an overall thickness. According to some embodiments the electrode 403 may be subjected to X-ray fluorescence (XRF) testing to determine an overall initial thickness of the electrode 403. The initial thickness of the electrode 303 may be about 50-200 Å in some embodiments.

Figure 6:
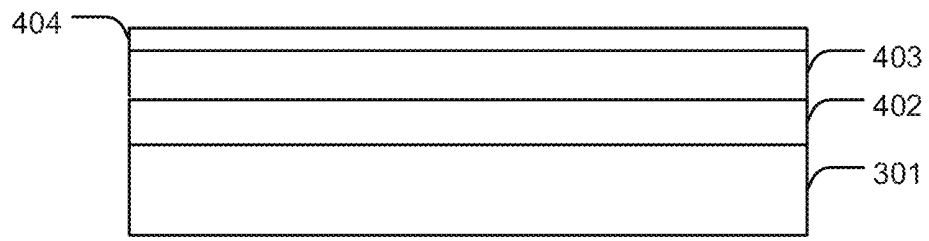
FIG. 6 illustrates a portion of a method of combinatorial optimization of interlayer parameters, according to some embodiments.

As shown in FIG. 6, the method may further include forming an interlayer 304 on the electrode 403. The interlayer 404 may be formed using an Atomic Layer Deposition (ALD) chamber as described above, for example, by sequentially increasing a number of ALD cycles to increase interlayer thickness from one partition to the next as to obtain one or more different interlayer thicknesses for a single substrate. According to some embodiments, the interlayer thicknesses may be varied in increments of at least 5 Å between different partitions of the substrate 301. According to some embodiments, the interlayer thicknesses range from 5-20 Å for a first substrate to be tested/optimized. The interlayer 404 may be formed of Titanium Oxide (TiOx) according to some embodiments. The interlayer may be formed using one or more precursor chemistries, where the precursor chemistries do not include ozone in some embodiments. According to some embodiments, the precursor chemistries include Titanium Tetra Iso-Propoxide (TTIP) and water ($H_2O$), where water is the oxidant. The strength and dispersal rates of each of the precursor chemistries, which include the precursor and oxidant, may also be changed for each partition to ascertain optimal precursor chemistries. Thus through the combinatorial techniques described herein, a single substrate may be used to evaluate a plurality of interlayer thicknesses, precursor chemistries, and processing parameters.

Figure 7:
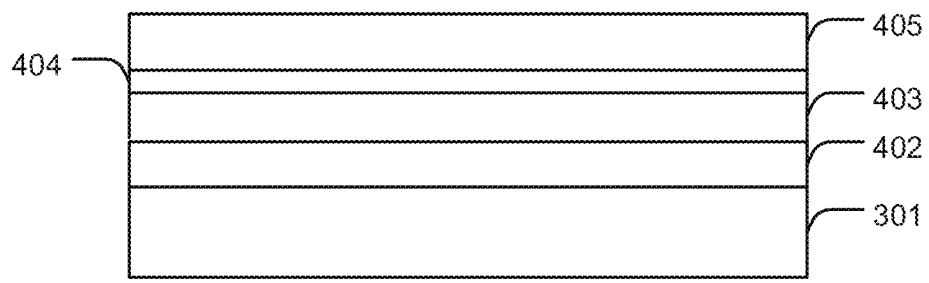
FIG. 7 illustrates a portion of a method of combinatorial optimization of interlayer parameters, according to some embodiments.

As shown in FIG. 7, the method includes forming an oxide bulk layer 405 on the interlayer 404. The oxide bulk layer 405 may be formed using an ALD chamber as described above or a conventional full wafer processing deposition chamber. According to some embodiments, the oxide bulk layer 405 is a TiOx bulk layer. The oxide bulk layer 405 may have a thickness of about 50-200 Å according to some embodiments. The oxide bulk layer 405 may be deposited using one or more chemistries dispersed on a surface of the interlayer 404.

According to some embodiments, the chemistries dispersed to form the oxide bulk layer 405 include pentamethylcyclopentadienyl tris(methoxy) titanium (NXTA1) and ozone ($O_3$). According to some embodiments, the oxide bulk layer 405 may be formed with relatively high strength ozone. Relatively high strength ozone may include ozone of about 18% with the remaining percentage composed of oxygen.

After forming the oxide bulk layer 405, the electrode 403 maybe evaluated again to determine an overall thickness after bulk layer formation. For example, XRF testing may again be applied to determine the extent of surface imperfections and etching caused by forming the bulk oxide layer 405. This information may be used to further optimize interlayer parameters combinatorially as described above with reference to FIGS. 1-3.

Figure 8:
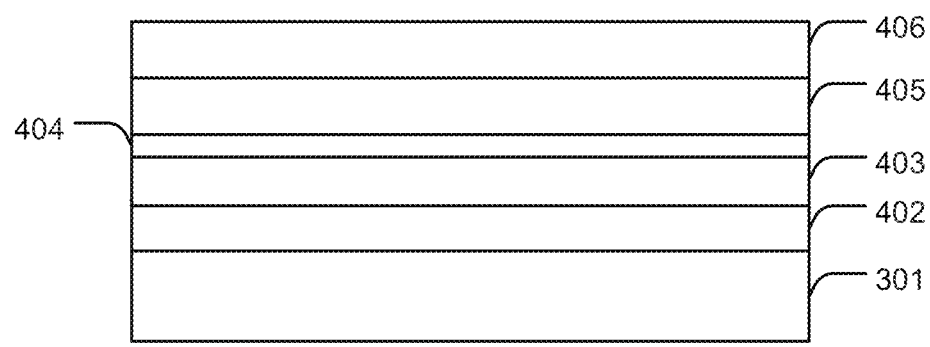
FIG. 8 illustrates a portion of a method of combinatorial optimization of interlayer parameters, according to some embodiments.

As shown in FIG. 8, a second electrode 406 may be formed on the bulk layer 405 to complete a capacitor stack. The second electrode 406 may be formed of a relatively high work function metal or conductor. According to some embodiments, the relatively high work function conductor is ruthenium (Ru). Examples of relatively high work function conductors include TiN, Ruthenium, Platinum, Tungsten, TaN, or any combination thereof.

Figure 9:
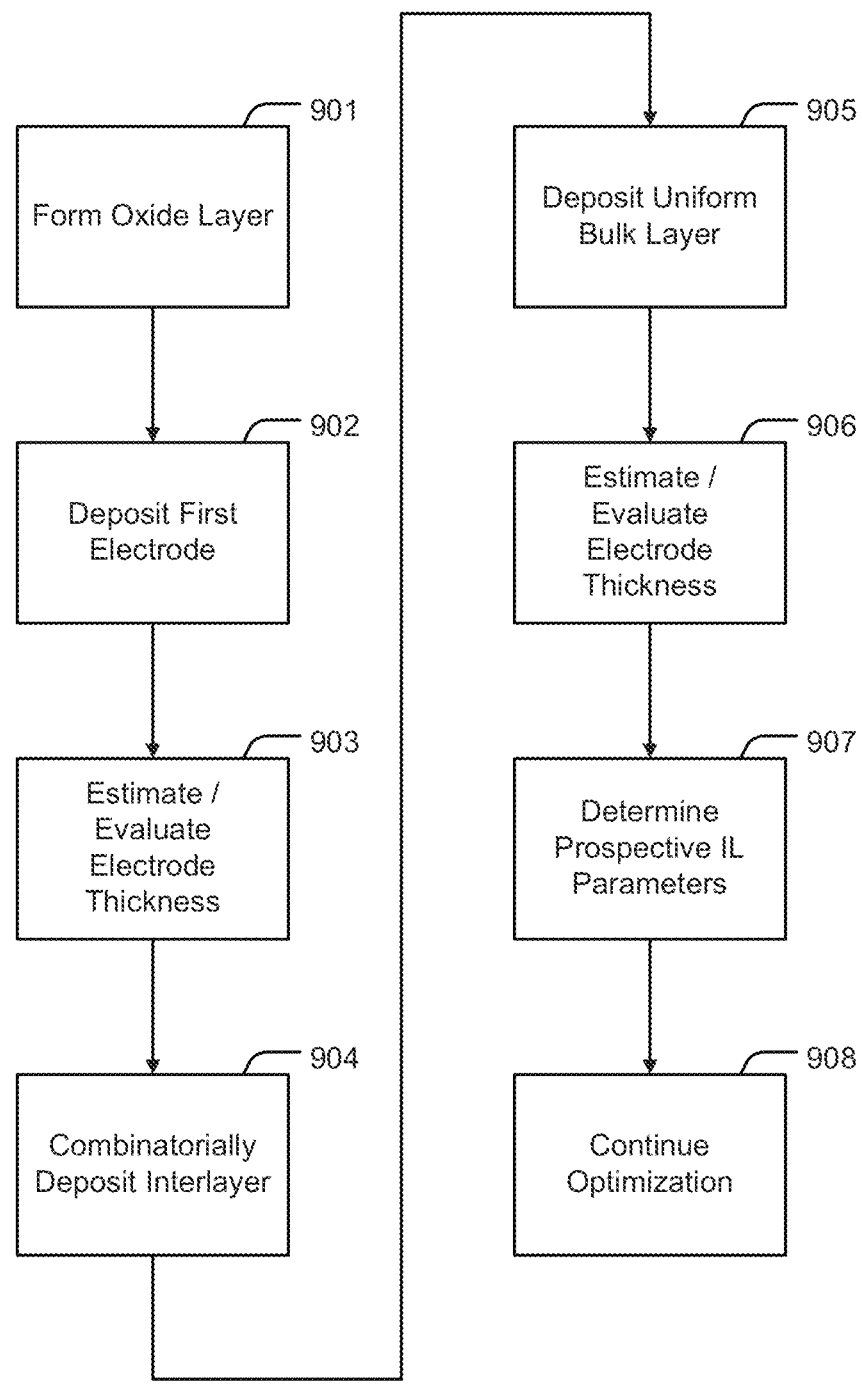
FIG. 9 illustrates a method of combinatorial optimization of interlayer parameters, according to some embodiments.

As stated above, the methodologies presented in FIGS. 4-8 may be incorporated into a combinatorial process to optimize one, more, or all interlayer parameters to reduce electrode etching when forming a bulk oxide layer. Turning to FIG. 9, a method of combinatorially optimizing interlayer parameters is presented.

The method 900 includes forming an optional oxide layer on a substrate at block 901 (e.g., see FIG. 4). The method 900 further includes depositing a first electrode on the oxide layer or the substrate at block 902 (e.g., see FIG. 5). The method 900 then advances to estimating/evaluating electrode thickness at block 903. For example, electrode thickness may be determined through X-ray fluorescence testing.

The method 900 further includes combinatorially depositing or forming an interlayer on separate regions of the electrode at block 904. Combinatorially depositing or forming the interlayers may include sequentially exposing separate partitions of the substrate to differing rates, compositions, strengths, and/or types of precursor chemistries in a reaction chamber. Combinatorially depositing or forming the interlayers may also include varying a number of deposition cycles across one or more separate partitions or regions of the substrate in a reaction chamber. For example, in some embodiments one region may be selectively exposed more than the next region in order to sequentially increase the thickness of the interlayer as described above. Combinatorially depositing or forming the interlayer may also include any number of combinatorial techniques configured to form interlayers of varying thicknesses across separate regions of the electrode on the substrate. In some embodiments, the thickness of the interlayer may remain substantially constant across the regions but other parameters such as precursor and oxidant compositions and chemistries may be varied across the regions. For example, the same precursor chemistry utilized for the deposition of the bulk oxide layer may be utilized for the interlayer with the concentration of the oxidant, e.g., ozone, varied. In some embodiments, the concentration of the ozone may vary from 3% to 12% for the formation of the interlayer, as opposed to the approximate 18% concentration for formation of the bulk oxide layer. In other embodiments, a different precursor and/or oxidant may be used for the formation of the interlayer then the precursor and chemistry used for the formation of the bulk oxide. For example, the precursor chemistries may include Titanium Tetra Iso-Propoxide (TTIP) and water ($H_2O$), where water is the oxidant for the formation of the interlayer.

The method 900 further includes depositing a uniform bulk oxide layer across all interlayers of the substrate at block 905. For example, a uniform bulk oxide layer is a bulk oxide layer formed of the same precursor chemistry and deposition process across all combinatorially deposited interlayers such that electrode etching can be appropriately evaluated in some embodiments. In these embodiments, the oxidant concentration, e.g., ozone concentration may be approximately 18%. In some embodiments, both the interlayer and the bulk oxide layer are Titanium oxide. As noted herein, the interlayer and the bulk oxide layer may be formed from the same or different precursor chemistries. That is, the bulk oxide layer and the interlayer may be formed from a precursor chemistry of NXTA1 and ozone or the bulk oxide layer is formed from a precursor chemistry of NXTA1 and ozone, while the interlayer is formed from a precursor chemistry that includes Titanium Tetra Iso-Propoxide (TTIP) and water ($H_2O$).

The method 900 further includes estimating/evaluating electrode thickness at block 906. For example, electrode thickness may be determined through X-ray fluorescence testing. Thus, block 906 may be performed similar to block 903 and may be termed a post-measurement. It should be appreciated that this post-measurement gives a measure of electrode etching due to oxide bulk layer deposition.

The method 900 further includes determining prospective interlayer parameters at block 907. The prospective interlayer parameters may be derived from disparity in electrode thickness as determined through blocks 903 and 906, and may include candidates for secondary screening. These candidates may include any number of interlayer parameters as described above. In addition, properties other than thickness may be evaluated here. For example, electrical properties or properties impacting electrical performance of the capacitor, such as surface roughness, etc. The method 900 further includes continuing optimization at block 908 until optimal, or near optimal, interlayer parameters are determined. Continuing optimization may include combinatorial processing during a secondary screen, selecting promising candidates from the secondary screen for a tertiary screen, and so on. In addition, feedback from later stages to earlier stages can be used to refine the success criteria and provide better testing and optimization results.

When compared to existing methods and apparatuses, the embodiments described can provide rapid combinatorial processing techniques which increase productivity in research and development of new materials, chemistries, and processing of semiconductor substrates and associated devices. The above methods can be used to determine the optimum thickness of an interlayer necessary to prevent electrode etching from bulk layer deposition. Additionally, the above methods can also be used to determine an optimum thickness of the interlayer necessary to promote growth of a rutile bulk layer.

The corresponding structures, materials, acts, and equivalents of all means plus function elements in any claims below are intended to include any structure, material, or acts for performing the function in combination with other claim elements as specifically claimed.

Those skilled in the art will appreciate that many modifications to the exemplary embodiments are possible without departing from the spirit and scope of the present invention. In addition, it is possible to use some of the features of the present invention without the corresponding use of the other features. Accordingly, the foregoing description of the exemplary embodiments is provided for the purpose of illustrating the principles of the present invention, and not in limitation thereof, since the scope of the present invention is defined solely by the appended claims.

What is claimed:

1. A method of combinatorial optimization of interlayer parameters, the method comprising:
   depositing a first electrode on a substrate;
   combinatorially forming a plurality of interlayers on separate site isolated regions of the first electrode, the plurality of interlayers being formed based on at least one sequentially altered parameter;
   depositing a bulk oxide layer across the plurality of interlayers;
   determining a change in thickness of the first electrode for each separate site isolated region of the first electrode after depositing the bulk oxide layer; and
   determining prospective interlayer parameters based on the change in thickness of the first electrode.

2. The method of claim 1, wherein determining the change in thickness of the first electrode comprises:
   determining an initial thickness of the first electrode; and
   determining a second thickness of the first electrode after depositing the bulk oxide layer.

3. The method of claim 2, wherein:
   determining the initial thickness of the first electrode comprises X-ray fluorescence testing of the first electrode.

4. The method of claim 1, further comprising:
   depositing a second electrode over the bulk oxide layer.

5. The method of claim 1, wherein the first electrode comprises ruthenium.

6. The method of claim 1, further comprising:
   forming an oxide layer on the substrate, wherein the first electrode is deposited on the oxide layer.

7. The method of claim 6, wherein the oxide layer is 3000 Angstroms in thickness.

8. The method of claim 1, wherein the first electrode is between 50-200 Angstroms in thickness.

9. The method of claim 1, wherein combinatorially forming the plurality of interlayers comprises:
   sequentially exposing the separate site isolated regions of the first electrode to at least two different chemistries.

10. The method of claim 9, wherein the sequentially exposing comprises, exposing the first electrode to Titanium Iso-Propoxide (TTIP) and then exposing the first electrode to water.

11. The method of claim 9, wherein the at least one sequentially altered parameter is a chemical concentration of one of the at least two different chemistries.

12. The method of claim 9, wherein the at least one sequentially altered parameter is a time of exposure to either one of the at least two different chemistries.

13. The method of claim 1, wherein the at least one sequentially altered parameter is a thickness of each deposited interlayer.

14. The method of claim 1, wherein the at least one sequentially altered parameter is a number of deposition cycles for each separate region of the first electrode.

* * * * *